(12) United States Patent
Sun (10) Patent No.: US 6,256,223 B1
(45) Date of Patent: Jul. 3, 2001

(54) CURRENT-INDUCED MAGNETIC SWITCHING DEVICE AND MEMORY INCLUDING THE SAME

(75) Inventor: Jonathan Zanhong Sun, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/597,223

(22) Filed: Jun. 20, 2000

Related U.S. Application Data (62) Division of application No. 09/123,523, filed on Jul. 28, 1998.

(51) Int. Cl.⁷ .................................................. G11C 13/00
(52) U.S. Cl. ............................................. 365/171; 365/143
(58) Field of Search ............................. 361/143; 365/171

(56) References Cited

U.S. PATENT DOCUMENTS

| 5,173,873 | 12/1992 | Wu et al. . |
| 5,251,170 | 10/1993 | Daughton et al. . |
| 5,329,486 | 7/1994 | Lage . |
| 5,541,868 | 7/1996 | Prinz . |
| 5,587,943 | 12/1996 | Torok et al. . |
| 5,650,958 | 7/1997 | Gallagher et al. . |
| 5,695,864 | 12/1997 | Slonczewski . |
| 5,745,406 | 4/1998 | Yamane et al. . |
| 5,825,685 | 10/1998 | Yamane et al. . |
| 6,130,814 | * 10/2000 | Sun ...................................... 361/143 |

FOREIGN PATENT DOCUMENTS 409139068A    5/1997   (JP) .

* cited by examiner

Primary Examiner—Terrell W. Fears
(74) Attorney, Agent, or Firm—McGinn & Gibb, PLLC (57) ABSTRACT

A magnetic switching device, includes a first electrode, a second electrode, and a nanoparticle having a magnetic moment and being disposed between the first and second electrodes. At least one of the first electrode and the second electrode includes a magnetic material which has a net spin polarization in its conduction band for injecting, into the nanoparticle, an electrical current including a net spin polarization for overcoming the magnetic moment of the nanoparticle upon selection of a predetermined magnitude for the electrical current.

9 Claims, 4 Drawing Sheets

CURRENT-INDUCED MAGNETIC SWITCHING DEVICE AND MEMORY INCLUDING THE SAME

The present Application is a Divisional Application of U.S. patent appliction Ser. No. 09/123,523, filed on Jul. 28, 1998.

BACKGROUND OF THE INVENTION

1. Field of the Invention

The present invention generally relates to a switching device, and more particularly to a current-induced magnetic switching device for use with a nonvolatile memory array that uses magnetic memory elements as the individual memory cells.

2. Description of the Related Art

Magnetic random access memory (MRAM or typically referred to as "MagRam") technology is a solid state device technology using magnetic thin film elements as a storage mechanism. The storage mechanism relies on the relative orientation of the magnetization of two electrodes, and on the ability to discern this orientation by electrical means.

MRAM arrays include an array of magnetic memory cells positioned at the intersections of wordlines and bitlines. Generally, each cell includes a magnetically changeable or "free" region, and a proximate magnetically reference region, arranged into a magnetic tunnel junction ("MTJ") device (e.g., the term "reference region" is used broadly herein to denote any type of region which, in cooperation with the free or changeable region, results in a detectable state of the device as a whole).

Generally, the principle underlying storage of data in such cells is the ability to change the relative orientation of the magnetization of the free and reference regions by changing the direction of magnetization along the easy axis ("EA") of the free region, and the ability to thereafter read this relative orientation difference.

More particularly, an MRAM cell is written by reversing the free region magnetzation using applied bi-directional electrical and resultant magnetic stimuli via its receive bitline and wordline.

The MRAM cell is later read by measuring the resultant tunneling resistance between the bitline and wordline, which assumes one of two values depending on the relative orientation of the magnetization of the free region with respect to the reference region. If the free region is modeled as a simple elemental magnet having a direction of magnetization which is free to rotate but with a strong preference for aligning in either direction along its easy axis (+EA or –EA), and if the reference region is a similar elemental magnet but having a direction of magnetization fixed in the +EA direction, then two states (and therefore the two possible tunneling resistance values) are defined for the cell: aligned (+EA/+EA) and and-aligned (–EM +EA).

Thus, in operation as a memory device, the MRAM device can be read by measuring the tunneling resistance, thereby to infer the magnetization state of the storage layer with respect to the fixed layer. The MRAM can be written by reversing free layer magnetization using external magnetic fields. If the free layer is imagined as a simple elemental magnet which is free to rotate but with a strong energetic preference for aligning parallel to the X axis, and if the pinned layer is a similar elemental magnet but frozen in the +X direction, then there are at least two states possible for the device (e.g., aligned and anti-aligned) (i.e., in +X or –X directions).

Thus, a magnetic random access memory (RAM) requires write operations on small ferromagnetic elements. The conventional way of write-addressing has been to use an x-y cross-current excitation, which requires large write current, demands stringent magnetic switching characteristic from the memory element, and has cross-talk problems upon the increase of memory density.

Further, the conventional structures and methods do not allow for high packing density without cross-talk. Further, the driving circuits become complex due to the x-y selective magnetic-field induced write operation. Thus, conventional magnetic random access memory (RAM) requires read-write operations on small ferromagnetic elements, and have many problems.

A mechanism for the direct switching of the magnetic memory element has been proposed in J. C. Slonczewski, *J. Magn. and Magn. Mat.* 159, L1 (1996), which is based on the theoretical prediction of a new effect due to interactions between spin-polarized conduction electron and the ferromagnetic moments of the electrodes. However, such a proposal was strictly theoretical.

Further, in M. Tsoi et al., *Pins. Rev. Len.*, 80, 4281 (1998), a point-contact device was constructed to show an anomaly in its current-voltage characteristic, which could be interpreted as spin-wave excitation due to the momentum transfer effect mentioned above. However, such a model was strictly hypothetical.

Further, it is noted that recently in manganite trilayer junctions, large low-field magnetoresistance (MR), of up to an order of magnitude change in resistance, was observed at 14° K in 100 Oe. The junctions are made of epitaxial $La_{0.67}(Sr/Ca)_{0.33}MnO_3$(LSMO or LCMO) thin film electrodes with a $SrTiO_3$ (STO) barrier. These manganites are expected to be half-metals when their ferromagnetic order is fully developed. Band calculations show that their minority band has a very low carrier concentration, making it prone to disorder-induced localization.

According to a spin-dependent tunneling model, a half-metallic metal-insulator-metal junction would exhibit large, almost infinite MR. However, the observed transport characteristics do not resemble a clean metal-insulator-metal tunneling junction. The resistance varies strongly with temperature, especially above 130° K. The MR decreases rapidly as temperatures increases, vanishing above 130° K, well below the Curie temperature of the thin film electrodes which is around 360° K. The MR is bias-dependent, suppressed by a voltage of around 0.2V. Inhomogeneides of transport current at the junction interface is suspected, and the exact mechanism for such large low-field MR is not well understood.

SUMMARY OF THE INVENTION

In view of the foregoing and other problems of the conventional structures and methods, an object of the present invention is to provide a structure and method which is optimal for small magnetic memory structure where magnetic switching thresholds are more stable than the conventional techniques.

Another object is to provide a write-operation that allows for high packing density without cross-talk.

A further object is to provide a structure in which simpler driving circuits are employed.

In a first aspect of the present invention, a magnetic switching device includes a first electrode, a second electrode, and a nanoparticle having a magnetic moment and being disposed therebetween, at least one of the first electrode and the second electrode including a magnetic material which has a net spin polarization in its conduction band for injecting, into the nanoparticle, an electrical current including a net spin polarization for overcoming the magnetic moment of said nanoparticle upon selection of a sufficient magnitude for the electrical current.

With the present invention, a magnetic switch is provided in which switching is caused by a current having a net spin which arises in one electrode of a two-electrode device having a magnetic nanoparticle therebetween. The one electrode includes a magnetic material including a net spin polarization in its conduction band. The magnetic interaction of the spin-polarized current can be used to rotate the magnetic moment of the nanoparticle, thereby switching the resistance state for current flow between the two electrodes.

Thus, with the unique and unobvious structure and technique of the present invention, the invention is optimized for small magnetic memory structures where magnetic switching thresholds are more stable than the conventional techniques. Further, high packing density without cross-talk is achieved. Moreover, simpler driving circuits may be employed with the invention as compared to the conventional structures and techniques.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Referring now to the drawings, and more particularly to FIGS. 1–3C, there is shown a preferred embodiment of the present invention.

Generally, the present invention improves upon the conventional devices in terms of the read/write operation and other operations. The present invention is based on momentum transfer from spin-polarized conduction carriers. The technique and structure of the present invention are intrinsically optimal for small magnetic memory structures, where magnetic switching thresholds are more stable. The invention allows extremely high packing density without cross-talk. Further, the invention and its objectives are achieved by simpler driving circuits than the current architecture of an x-y selective magnetic-field induced write.

The invention has been verified by experimental results which verify the quantitative model and finds especially great benefit in a magnetic RAM architecture for a new magnetic memory element, and which are discussed in regard to FIGS. 4–7 below.

The present invention discloses a current-driven magnetoresistive switch. The inventive switch constitutes the basic storage element for a new magnetic RAM architecture. In this architecture according to the present invention, separate wiring levels for the "write" operation are unnecessary. The "write" operation can be accomplished using the same x-y read-out grid and by momentarily biasing the magnetoresistive switch up to a current level above its switching threshold, causing it to change its magnetic state, thus accomplishing the function of "writing".

Figure 1:
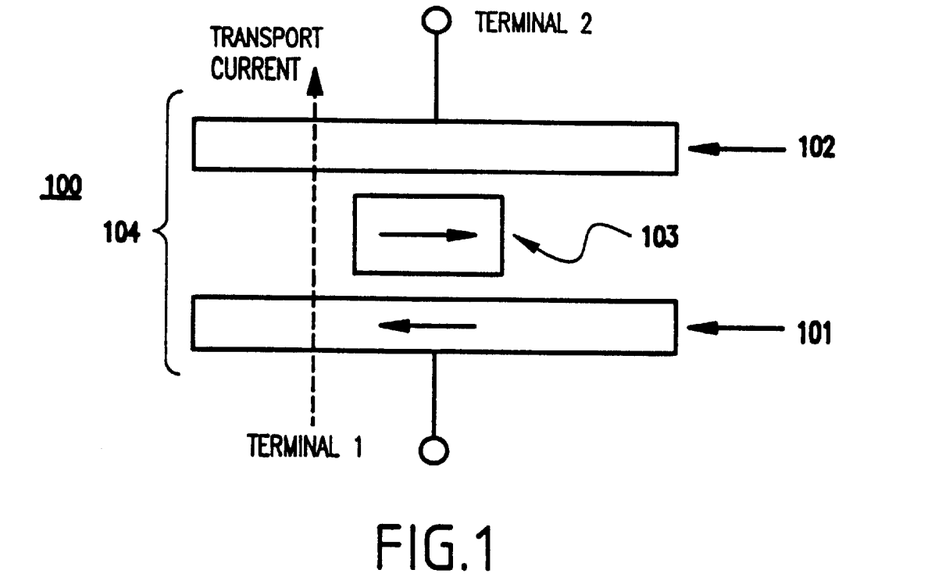
FIG. 1 is a schematic diagram of the preferred structure of a current-driven magnetic switch according to the present invention.

Referring to FIG. 1, the inventive structure 100 is shown as exemplary embodied as a switch.

FIG. 1 illustrates a preferred embodiment of a current driven magnetic switch 100 according to the present invention. In FIG. 1, the switch 100 includes a two-terminal junction which is constructed in which at least one (e.g., one or both) of the leads of the junction is made of ferromagnetcally ordered metallic material (including conducting magnetic oxides). Examples of candidate electrode materials include (but are not limited to) at least one of Fe, Co, $Ni_{1-x}Fe_x$, $CrO_2$, $La_{0.67}Sr_{0.33}MnO_3$, $La_{0.67}Ca_{0.33}MnO_3$, and alloys thereof, etc.

Specifically, first and second electrodes 101, 102 are provided with a magnetic nanoparticle 103 situated between the first electrode 101 and the second electrode 102. Candidate materials for the nanoparticles include (but are not limited to) at least one of Fe, Co, $Ni_{1-x}Fe_x$, $CrO_2$, $La_{0.67}Sr_{0.33}MnO_3$, $La_{0.67}Ca_{0.33}MnO_3$, and alloys thereof, etc.

As shown in FIG. 1, structural elements 101–103 and 102–103 form two magnetic junctions 104 between the two terminals. The first electode 101 and the magnetic nanoparticle are ferromagnetically ordered. The second elecrode 102 may or may not be ferromagnetic, but preferably also is ferromagnetic for bi-polar operations.

The tic nanoparcle 103 is electrically connected to both the first and second electrodes, 101, 102, either by spin-depedent tunneling, or via some other conduction mechanism (such as filamentary conduction, point-contact conduction, etc.) that preserves the spin-information of the conduction carriers. The relative alignment of the magnetic moment between the magnetic nanoclust and the ferromagnetic (FM) electrodes 101 and 102 determines the two-ternunal resistance of the device 100. The arrows illustrate the magnetic orientation of the elecrode and the nanoparticle.

Hence, in FIG. 1, arrows represent the ferromagnetic moment. In the actual design of the device, the magnetic moment may assume different orientations as fitting for the optimal performce of the device's IV charcteristic, as shown in FIG. 2.

As mentioned above, the second electrode 102 may or may not be ferromagnetic, but preferably the electrode 102 is ferromagnetic since it is advantageous in terms of bipolar operations, having + and $-I_c$, and for ease of manufacturing.

Figure 2:
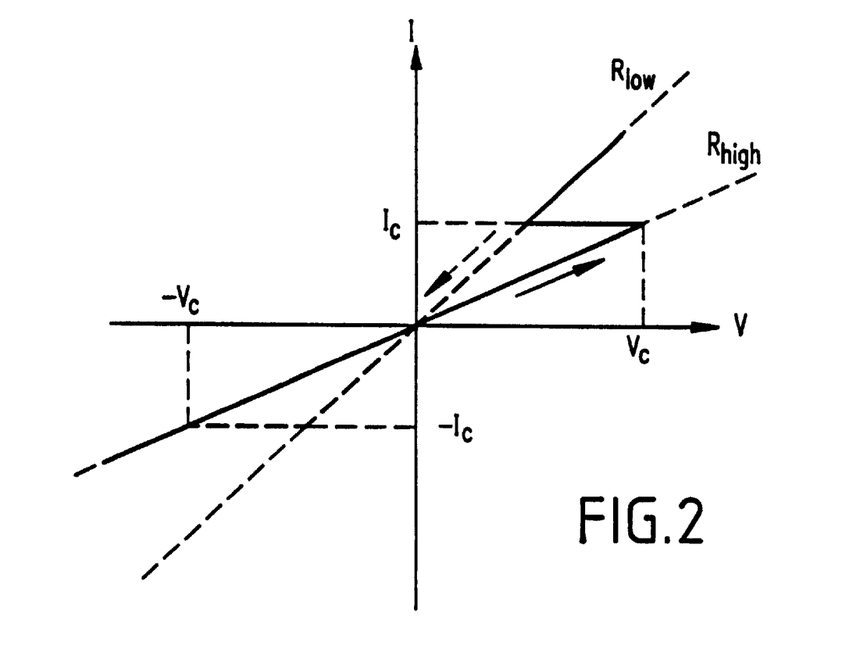
FIG. 2 illustrates a bi-stable IV characteristic of a junction constructed as shown in FIG. 1.

Moreover, for the IV characteristics shown in FIG. 2, it is necessary for the second electrode also to be formed of fermagnetic material.

The magnetic nanoparticle 103 is electrically connected to both the first and second electrodes, 101, 102, either by spin-dependent tunneling, or via some other conduction mechanism (e.g., such as point contact or filamentary conduction) that preserves the spin-information, thereby resulting in having a two-terminal resisnce sensitive to the relative alignment of magnetic moments between the first electrode and the magnetic nanoparticle. A small (e.g., $|I_{sense}|<|I_c|$; in an exemplary case $\sim 1$ $\mu$A) transport current is used to sense the two-terminal resistance of the device 100.

When transport current is increased beyond a certain threshold value, $I_c$, (e.g., $I_c$18 1 $\mu$A; for room temperature operation, $I_c \geq 100$ $\mu$A is expected, as discussed below), a rotation of the magnetic orientation of the magnetic nanoparticle 103 results, thereby changing the device's resistance.

As shown in FIG. 2, a bi-stable current-voltage (IV) characteristic of such a device is shown. Specifically, FIG. 2 illustrates a bi-stable IV characteristic of a junction constructed as exemplary shown in FIG. 1. The magnetic anisotropy energy, the amount of spin-polarizaon in the conduction band, and the effective Landau-Gilbert damping coefficient of the nanostructure determine the position of the threshold currents $I_c$ and $-I_c$. The two threshold currents in the + and −direction may or may not be equal in value.

Depending upon the orientation of the magnetic moment of the nanoparticle 103 with respect to the first and second electrodes, 101, 102, the junction may either be in its resistive-high ($R_{high}$) or resistive-low ($R_{low}$) state.

When a tort current exceeds the threshold $I_c$, the magnetic moment of the nanoparticle 103 flips, causing a switch of the resistance state. This current-voltage (IV) characteristic is a conceptual drawing for a magnetic Inanoparticle 103 with uniaxial magnetic anisotropy. In principle, more than two stable states may be possible in such a device if the magnetic nanoparticle has a more complex magnetic anisotropy energy.

Thus, with properly chosen materials parametrs (such as anisotpy field $H_K$, size of the nanoparlicle etc. (e.g., see Equations (2)–(5) below), it is possible to make such a device with a current-voltage charasteristic as shown in FIG. 2.

Essentially, the device characteristic calls for a nanocluster with an energy product in the range of several hundred Kelvin (e.g., ~6000° K), corresponding to a threshold current $I_c$ of the order of $I_c > \sim 100$ $\mu$A, and a magnetic nanopicle of the size of several hundred A (e.g., 300 Å for $Ni_{0.60}Fe_{0.40}$ particle (Permalloy)). Preferably, a large spin-polarizaton of conduction band (e.g., "large" being in a range of about $\eta \sim 0.1$ to 1.0)is desirable because that makes the difference between these two states described in FIG. 2 more distinguishable in resistance.

A memory array 30 may be constructed with the two-terminal device described above having such characteristics. For example, an exemplary architecture is illustrated in FIG. 3A having a plurality of structures 300 at intersections of the x-y grid (e.g., bitline-wordline grid).

Figure 3A:
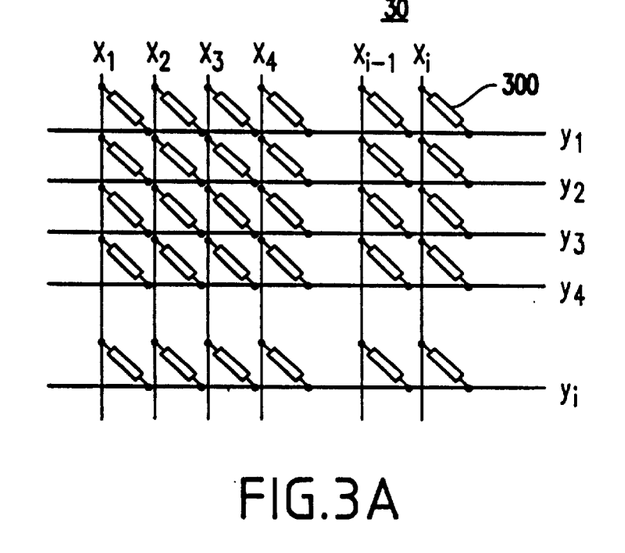
FIG. 3A illustrates x-y read-write grid of a magnetic RAM architecture using devices with an IV characteristic as illustrated in FIG. 2.
Figure 3B:
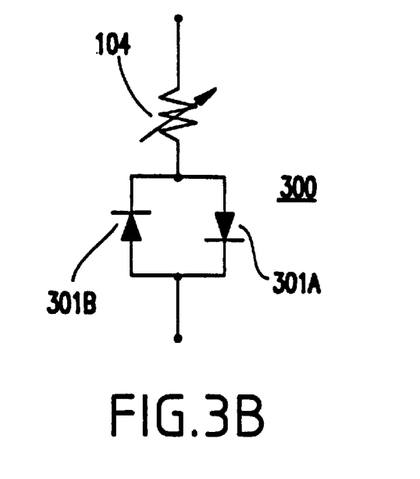
FIG. 3B illustrates the devices at each node composed of a magnetorestrictive element in series with a pair of back-to-back diodes.

In FIG. 3B, a stucture 300 is shown such that a pair of back-to-back diodes 301A, 301B is placed in series with each magnetic junction 104 to allow selective read-addressing. The same addressing circuit can be used for selective "write" operations. To do so, a supply cell ($x_i$, $y_j$) with a bias current exceeding $+I_c$ or $-I_c$. Is employed.

Figure 3C:
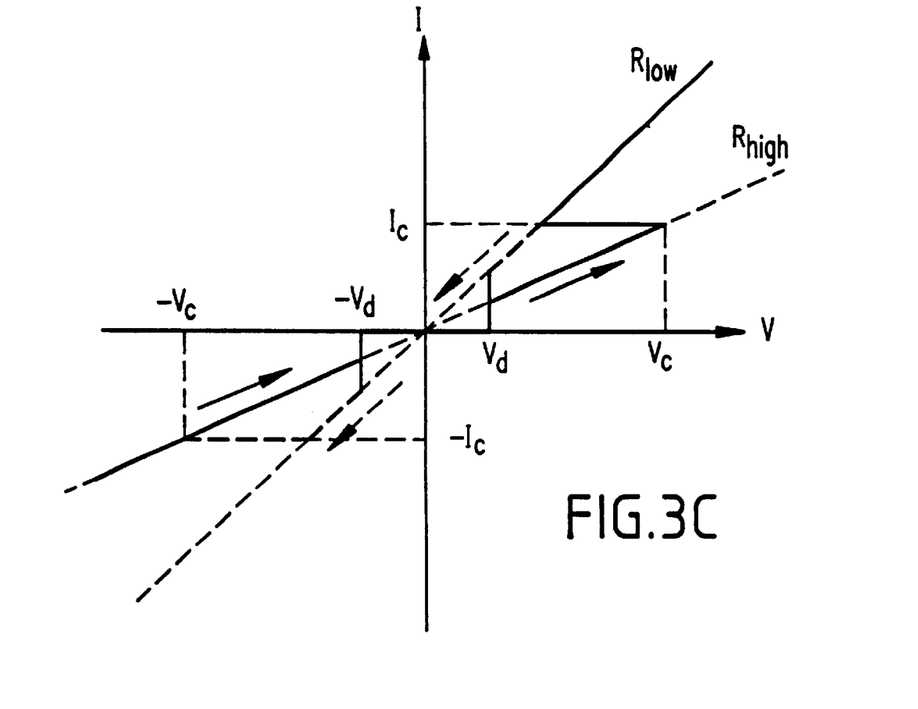
FIG. 3C illustrates a conceptual diagram of a the two-terminal IV characteristic for the circuit shown in FIG. 3B.

With properly chosen $I_c$ and $V_c$ as defined in FIG. 3C, the $I_c$ of only one junction situated at ($x_i$, $y_j$) may be selectively exceeded while keeping all other junctions unchanged.

Thus, in FIGS. 3A–3C, an exemplary construction is shown of a magnetic RAM architecture making use of devices with an IV characteristic as ilulstrated in FIG. 2. In FIG. 3A, an x-y read-write grid is shown, whereas FIG. 3B illustrates the device at each node which includes a magnetoresistive element 104 (i.e., device 100) in series with a pair of back-to-back diodes.

FIG. 3C illustrates a conceptual diagram of the two-terminal IV characteristic for the circuit shown in FIG. 3B. A bias current below $I_c$ reads out the istace of the magnetoresistive element. A bias current above $I_c$ switches it. Selective "read" of a node at ($x_i$, $y_j$) can be accomplished by biasing line $x_i$ above Vd and line $Y_j$ below $-V_d$, A proper selection of the magnetoeesistive element's resistances $R_{high}$, and $R_{low}$ and its threshold current $I_c$ would allow the same biasing scheme to be used for driving a single element at ($x_i$, $y_j$) above its critical current $I_c$, accomplishing the "write" oeration.

Thus, the present invention provides a magnetic nanoclueter junction including a ferromagnetic electrode, a ferromagnetic nanoparticle or other nanostructures, and a counter electrode, as illustrated in FIG. 1.

Additionally, the present invention provides a current-driven magnetic switch with an exemplary, non-limiting structure illustrated in FIG. 1A that has an exemplary two-terminal current-voltage characteristic as illustrated in FIG. 2.

Further, the present invention provides a magnetic random-access memory architecture as illustrated in FIGS. 3A–3C, in which the current-driven switch as described above and illustrates in accordance with the curent-voltage charsterristic of FIG. 2 is used as the basic memory cell. Both read and write function are achieved using the same addressing circuit.

Thus, the present invention provides a magnetic switch in which switching is caused by a current having a net spin which arises in one electrode of a two-electrode device having a magnetic nanoparticle therebetween. The one electrode includes a magnetic material including a net spin polarization in its conduction band. The magnetic intracion of the spin-polarized current can be used to overcome the magnetic moment of the nanoparticle, thereby switching the resistance state for current flow between the two electrodes.

Other addressing methods also can be used in conjunction with the inventive magnetoresistive switch (e.g., element 104 in FIG. 3B). Some examples of different address methods are described, for example, in R. E. Matick, *Computer Storage System and Technology*, John Wiley & Sons (1977), Chapter 4.10, page 321.

Thus, the present inventor has observed a new effect in these junctions, and namely a current-induced switching of magnetic state. This phenomenon sheds new light onto the materials physics at the junction interface.

The present invention provides a model based on spin dependent transport across the junction interface via magnetic nanoclusters, and coherently describes the origin for the temperature and field dependence of the junction's tansport characteristics. The model of the invention also has lead to the concept of a spin went driven switch that forms the basic storage element for a new type of magnetic random access memory, and as described above.

It is noted that LSMO/STO/ILSMO trilayer junctions are used for this study. Regarding fabrication, briefly, the trilayers were grown epitaxially on NdGaO$_3$ (110) substrates (NGO) using laser ablation at a substrate temperature of 750° C. The junctions were formed, for example, using optical photolithography and ion-milling. The bottom layer LSMO is aboot 600 Å thick, and the top LSMO is about 400 Å thick. The barrier STO is nominally 30 Å thick, and the roughness at the junction interface is estimated to be less than 15 Å.

The dc resistance of the junction in its resistive-high and resistive-low state are defined as $R_{high}$ and $R_{low}$ respectively. These junctions show large magnetoresistance at low temperature. A ratio of $R_{high}/R_{low}=9.7$ has been observed at 14° K and 100 Oe. Below, the transport properties of such junctions with large magnetoresistance are further discussed.

Figure 4:
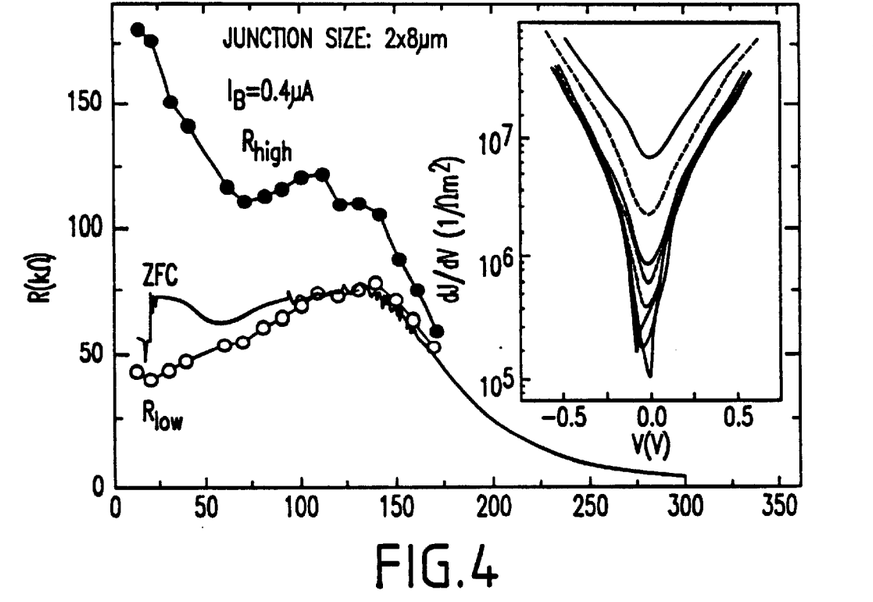
FIG. 4 illustrates the temperature-dependent resistance of a junction resistance.

FIG. 4 illustrates a representative temperature dependence curve of a A junction resistance, R(T). The junction is 2×8 $\mu m^2$ in size. For the zero field current (ZFC cre, data were collected during cooling in a nominally zero field (e.g., a residual field of around 1 Oe is expec). Bias current was swept between ±0.4 $\mu A$ for each temperature point, and the least-square slope is taken as the junction resistance. Curves $R_{high}$ and $R_{low}$ indicate the dc junction resistance In resistive-high and -low state, respectively, at 0.4 $\mu A$ of junction bias current.

The inset of FIG. 4 illustrates the evolution of difrential conductance of the junction as a function of temperature. For curves from the top down, the corresponding temperatures 250° K, 200° K, 160° K, 140° K, 120° K, 80° K, 40° K, and 13° K, respectively. As shown, a low-bias conductance mininium steadily develops at low temperature, becoming noticeable first around 150° K.

Thus, FIG. 4 shows the temperature depdent resistance of a 2×8 $\mu m^2$ junction, characteristic of these devices. Upon cooling from the ambient, junction resistance R(T) first increases. Below 130° K, R(T) flattens, becomes more noisy, and the device begins to show a significant MR. The noise in the data is due to magnetic instabilities in the electrodes. The current voltage characteristic is nonlinear. A low-bias conductance minimum develops for temperatures below 150° K and biases below 0.2 eV, as shown in the iset of FIG. 1.

For many junctions, the current-voltage (IV) characteristics contain abrupt steps at well defined currents, usually for temperatures below 50° K and in the curent range of 0.5–5$\mu A$. For some junctions, the steps are very large, and they often pond to the field-induced transition of the junction magnetoresistace from $R_{low}$ to $R_{high}$ state. These steps show up in differential conductance as peaks as can be seen in the inset of FIG. 1.

Figure 5:
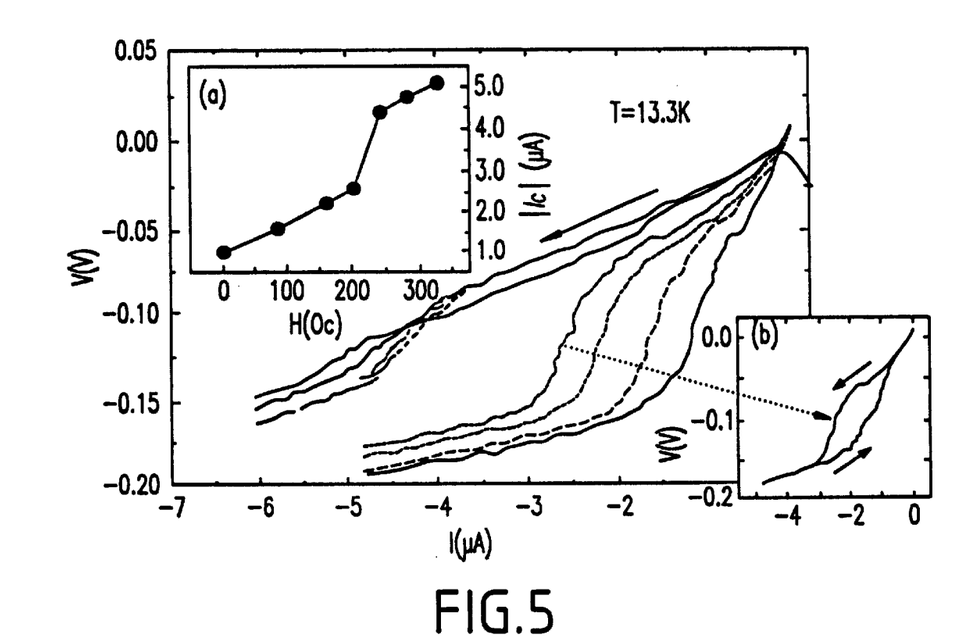
FIG. 5 illustrates an example of a step in the current-voltage (V) characteristic.

FIG. 5 illustrates one exnample of a step in the IV charasteristics. Each curve represents 200 trace-averages. The step position $I_c$ has a cerin distribution, which softens the step shown in these curves. $I_c$ moves out as the applied field is increased. For curves shown in FIG. 5, the applied fields are, from rigit to left: 1.6 Oe, 83 Oe, 163 Oe, 202 Oe, 244 Oe, 287 Oe, and 331 Oe, respectively. The inset (a) of FIG. 5 shows the $I_c$'s dependence on magnetic field H. The IVs are generally hysteric. One trace with hysteresis is shown in inset (b) of FIG. 5. For clarity, only curves with incresing-sweep of current are shown in the main panel, as indicated by the arrow.

Thus, FIG. 5 shows more details of one such step observed in IV characteristics. The transition occurs at a critical current $I_c$-1 $\mu A$ in zero field (the IV is asmetric in this case. No corresponding transition was observable at +1[|g]mA). The value of $I_c$ is not always exactly the same between different traces of IVs.

For a given set of measurment conditions (fixed temperature, field, and amplitude of IV sweep), the value of $I_c$ distributes within a narrow band, making the step appear rounded after trace-averaging, as shown in FIG. 5. The mean-center position of $I_c$ (defined as the peak position of dV/dI) shows a systematic dependence on the applied magnetic field, suggesting the involvement of a magnetic process. The step was from high-conductance to low-conductance when the bias current exceeds $I_c$. The sudden change of $I_c$(H) around 200 Oe is indicative of a change in ground-state magnetization direction for the magnetic cluster.

The present invention shows below that such behavior is consistent with spin-depent transport through a magnetic nanoparticle, when the interaction between spin-polarized transport current and the ferromagnetic moment of the nanocluster is included. As shown, transport across junction interface is via clusters residing at the junction interface. For certain conditions, one such cluster could dominate the transport. This is the example considered for data presented in FIG. 5.

Interaction between spin-polarized transport current and ferromagnetic electrode has been of recent theoretical interst, and this interaction has been investigated theoretically in several different configurations. Recently, experimental observations were made of spin-current excitations in a device with point-contact transport into a thin film superlattice of Co/Cu. The essence of the physics is the exite of a spin-momentum transfer between the spin-polarized conduction electron and the magnetic moment in the electrode.

Figures 6A, 6B:
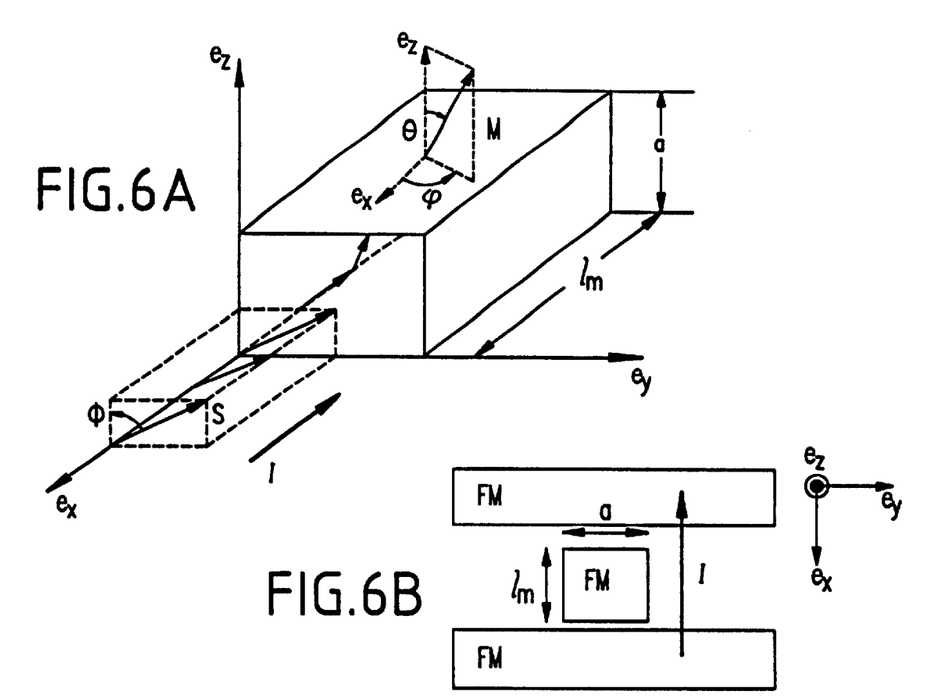
FIG. 6A illustrates the geometry considered of a model employed with the present invention.
FIG. 6B illustrates an exemplary conduction mechanism at the junction interface.

FIG. 6A illustrates the geometry considered when deriving Equation 1 and specifically shows an exemplary model used, where as FIG. 6B illustrates an exemplary conduction mechanism at the junction interface. The dominant conduction channel is through a single magnetic cluster, assumed to be $a^2$ on the side and $1_m$ in length. Ferromagnetic electrodes are designated as "FM".

Regarding the physics, assuming a transport current with spin-polarization factor $\eta=(n_\uparrow-n_\downarrow)/(n_\uparrow+n_\downarrow)$, where $n_{52 \downarrow}$ are carrier densities in the spin-up and the spin-down channels, respectively. $|\eta|=1$ corresponds to complete spin-polarization.

Assume the current enters the front side of the ferromagnetic particle with its spin making an angle $\phi$ with the $e_z$ axis, which is the inital direction of M, as illustrated in FIG. 6A. After a distance $1_m$ along $-e_x$, its spin becomes aligned with that of M.

The net momentum change of the carrier stream is deposited into a volume of (unit area) x $1_m$ as a torque $\Gamma$ on the total moment per unit area on the total moment per unit area $1_m M:\Gamma+sn_m x(n_s x\ n_m)$, where $$s = \left(\frac{h}{2e}\right)\eta J$$

is the spin current density, J the electrical current density, $$n_m = \frac{M}{|M|}$$

is the unit vector for M, $n_s$ is the unit vector for carrier spin's initial orientation. If M is in an uniaxial anisotropy potential with the easy axis aligned along $e_z$, and a magnetic field $H_\alpha$ is applied along $e_z$, that adds another torque term to the cluster:

$$\Gamma_B = l_m \frac{\partial U_K(\theta)}{\partial \phi} e_B = l_m M(H_K \cos\theta + H_\alpha)(n_m \times e_z),$$

where $$H_K = \frac{2K}{M}$$

is the easy-axis switching field, and $$e_B = \frac{n_m \times e_z}{|n_m \times e_z|}.$$

The dynamics of M can be described by the Landau-Lifshiz-Gilbert equation as:

$$\frac{dn_m}{dt} = \left(\frac{\gamma}{l_m M}\right)(\Gamma + \Gamma_B) - \alpha n_m \times \frac{dn_m}{dt} \quad (1)$$

where $\gamma = g\mu_B/h$ is the gyromagnetic ratio (assume g = 2), and $\alpha$ is the Landau-Gilbert damping coefficient. The effect of a spin current s on M is to add a fictitious excitation field $$H_I(t) = \left(\frac{\hbar}{2e}\right) \eta J(n_s \times n_m)/l_m M.$$

If the excitation exceeds the combined anisotropy field and the applied field, an instability my be caused which eventually flips M. Using the angles defined in FIGS. 6A–6B, for small initial $\theta$, the instability threshold for Equation 1) is $$\left(\frac{s}{l_m M}\right)\cos\phi < -\alpha(H_K + H_\alpha),$$

or with properly defined direction of current:

$$J \rangle J_c \equiv \frac{1}{\eta}\left(\frac{e}{\hbar}\right)\left(\frac{\alpha}{\cos\phi}\right)(l_m M H_K)\left[1 + \left(\frac{H_\alpha}{H_K}\right)\right] \quad (2)$$

For transport through a nanocluster with cross-section area $a^2$ and length $1_m$ as shown in FIG. 6B, Equation (2) leads to a directional net critical current of.

$$I_c = \frac{1}{\eta}\left(\frac{2e}{\hbar}\right)\left(\frac{\alpha}{\cos\phi}\right)(a^2 l_m H_k)\left[1 + \left(\frac{H_\alpha}{H_K}\right)\right] \quad (3)$$

Assuming the transport is dominated by a single magnetic cluster, from the data in FIG. 5, the zero-field $I_c \sim 1.0$ μA, and the cluster's $H_K \approx 129$ Oe judging from the slope of $I_c(H_\alpha)/I_c(0)$. Assuming $\eta \sim 1$, $\theta = \pi$, and $\alpha \sim 0.02$, this gives an energy term $\alpha^2 l_m M H_e \sim 1.65 \times 10^{-13}$ erg. Assume for this local LSMO cluste M=500 emu/cm$^3$, this gives $\alpha^2 l_m \sim 2.55 \times 10^{-18}$ cm$^3$. Assuming a rather isotropic cluster, $\alpha \sim l_m \approx 137$ Å is obtained. This suggests that the sport in this case is dominated by one single cluster at the interface.

Mangante films grown with laser ablation are known to have a fair amount of particulates on the film surface. Hence, it is possible that a narticle having a size of 140Å is trapped at the junction interface, and is responsible for the spin dent trasport and magnetic switching in this case.

The energy term $\alpha^2 l_m M H_K$ is related to the superparamagnetic transition temperature $T_s$. The thermal transition life-time is $\tau \sim \tau_o \exp(E_o/k_B T)$ with $E_o = \frac{1}{2}\alpha^2 1_m M H_K$, and an attempt frequency of $1/\tau_o \sim \ln(\tau/\tau_o) \sim 10^9$ Hz. Setting a laboratory life-time of $\tau \sim 1$ sec, the superparamagnetic transition tempeature $T_s$ is obtained from $E_o/k_B T_s \sim \ln(\tau/\tau_o) \sim 20.72$, and thus $a^2 1_m M H_k \approx 41.44 k_B$, and $T_s \approx 30°$ K.

Looking at the data in FIG. 4, a prominent feature is shown both in ZFC R(T) and in $R_{high}$ (T) starting at T≈60° K, consistent with estimated $T_s$ described above. The premature disapprarance of MR at temperatures around 130° K may be related to superparamagnetic transition of other magnetic clusters present at the interface, perhaps from clusters with somewhat larger energy products an the one observed here.

These results lead to an observation for the operating temperature of the device. According to Equation (3), the critical current for switching the magnetic state of a junction containing a single nanocluster can be written in terms of the supermaragnetic transition temperature $T_s$. For a cluster with uniaxial anisotpy:

$$I_c(O) = \frac{1}{\eta}\left(\frac{2e}{\hbar}\right)\left(\frac{\alpha}{\cos\phi}\right)(41.44 k_B T_s) \quad (4)$$

If room temperature operation is desired, for a quick number estimate assume $T_s \sim 600°$ K, and assume the system has $\eta \sim 0.1$ and $\alpha \sim 0.01$, so as to be representative of metal-based ferromagnetic clusters, one has $I_c(0) \approx 104$ μA, which is suitable for a current-driven switch for a bi-stable memory element at room temperature. For a Permalloy-based junction, the corresponding nanocluster dimension would be around $\alpha \sim 300$Å.

The switching time $t_o$ of this simple model can be estimated from Equation (1). For a system with uniaxial anisotropy and $I > I_c$:

$$t_0^{-1} \approx \alpha\left(\frac{g\mu_B H_K}{\hbar}\right)\left[\left(\frac{I}{I_c}\right) - 1\right] \quad (5)$$

It is noted that $t_o$ to depends only on damping $\alpha$and the overdrive amplitude $I/I_c$ A typical $\alpha = 0.001$ and an overdrive amplitude $I/I_c = 2$give $t_o \sim 57$ ns (for g=2).

The exact position of $I_c$, and the shape of the switching transition in IV characteristics will depend on the magnetic anisotropy of the magnetic cluster, as well as its relative orientation with the local fenomagnetic moment of the elects. For manganite-based junctions, the necessary materials growth-control may be problematic. Presently, there is very little consistency with regard to the value of $I_c$ and the shape of the switching characteristics in a junction's IV characteristics.

Figure 7:
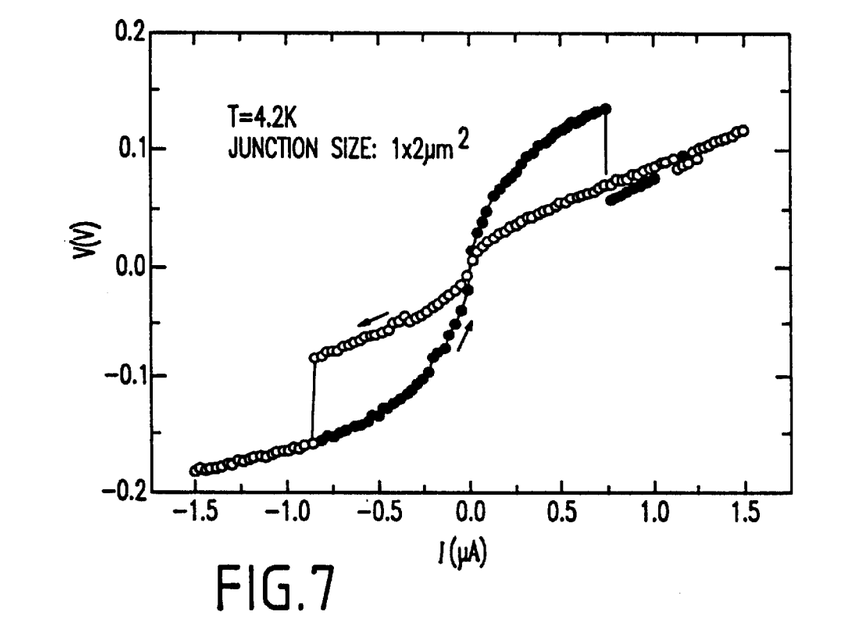
FIG. 7 illustrates an example of the I–V characteristic of the junction showing a clean switching characteristic.

However, for the many junctions tested by the present inventor, a junction was discovered which ans to contain a most suitable right magnetic anisotropy arrangement which gives an ideal switching characteristic. FIG. 7 shows the result from this junction Specifically, FIG. 7 ilustrates a junction showing a clean switching characteristic. The device was a LSMO/STO/LSMO junction epitxially grown on LaAlO$_3$ substrate. Such IV characteristics can be used readily for memory function. With better control of the interfce magnetic nanocluster size, such switching characteristic should work suitably at room temperature.

Thus, with the present invention, a tri-layer, spin-dependent magnetoresistive device is produced which shows a large magnetoresistive effect at temperature below 150° K, as well as a current-driven magnetoresistive switching.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A memory array, comprising:

a plurality of first metal lines;

a plurality of second metal lines approximately perpendicular to said plurality of first metal lines;

a plurality of two-terminal devices respectively provided at intersections of said first and second metal lines, each of said two-terminal devices including:

a pair of back-to-back diodes placed in series with a magnectic junction to allow selective read-addressing; and a supply cell with a bias current exceeding a positive or negative current threshold ($+I_c$ or $-I_c$) of said switch, said supply cell forming a same addressing circuit for selective write and read operations, wherein, with a predetermined $I_c$ and $V_c$ the $I_c$ of only one junction situated at an intersection of the first and second metal line is selectively exceeded while king all other junctions unchanged.

2. A magnetic memory, comprising:

a current-driven magnetic switching device forming a basic storage element for said memory; and an x-y grid, said switching device being formed at an intersection of said x-y grid, wherein said x-y grid is used for both reading and writing to said basic storage element such that said switching device is momentarily biased by a current level above its switching threshold, causing said switching device to change its magnetic state, thereby writing to said memory.

3. A magnetic nanocluster junction, comprising:

a ferromagnetic electrode;

a ferromagnetic nanoparticle having a first side adjacent said ferromagnetic electrode; and a counter electrode adjacent said ferromagnetic nanoparticle on a second side thereof.

4. The magnetic nanocluster junction according to claim 3, wherein said ferromagnetic electrode, said ferromagnetic nanoparticle and said counter electrode form a magnetic junction structure of one of $La_{0.67}MnO_3/SrTiO_3/La_{0.67}Sr_{0.33}MnO_3$ and $La_{0.67}MnO_3/SrTiO_3/La_{0.67}Ca_{0.33}MnO_3$.

5. A magnetic random-access memory architecture, comprising:

a phlrality of magnetic nanocluster junctions, each of said magnetic nanocluster junctions comprising:

a ferromagnetic electrode;

a ferromagnetic nanoparticle having a first side adjacent said ferromagnetic electrode; and a counter electrode adjacent said ferromagnetic nanoparticle on a second side thereof, said nanocluster junction forming a current-driven switch for a memory cell; and an addressing circuit for addressing a selected memory cell, wherein a read operation and a write operation are achieved using the addressing circuit.

6. The memory of claim 2, wherein said x-y grid comprises a bitline-wordline grid.

7. The memory of claim 2, wherein said switching device comprises a two-terminal device.

8. The memory according to claim 7, wherein said two-terminal device comprises:

a pair of back-to-back diodes placed in series with a magnetic junction, to allow selective read-addressing.

9. The memory according to claim 8, wherein said two-terminal device further comprises:

a supply cell with a bias current exceeding a positive or negative current threshold of said switching device, said supply cell forming a same addressing circuit for selective write and read operations.

* * * * *